United States Patent
Watanabe et al.

[11] Patent Number: 6,105,373
[45] Date of Patent: Aug. 22, 2000

[54] THERMOELECTRIC CONVERTER

[75] Inventors: Hideo Watanabe, Kanagawa; Hirofusa Tezuka, Hokkaido; Mitsutoshi Ogasawara, Hokkaido; Nobuhiko Suzuki, Hokkaido; Kazuya Sato, Hokkaido, all of Japan

[73] Assignee: Technova, Inc., Tokyo, Japan

[21] Appl. No.: 09/068,444

[22] PCT Filed: Sep. 5, 1997

[86] PCT No.: PCT/JP97/03136

§ 371 Date: Jul. 31, 1998

§ 102(e) Date: Jul. 31, 1998

[87] PCT Pub. No.: WO98/10474

PCT Pub. Date: Dec. 3, 1998

[30] Foreign Application Priority Data

Sep. 9, 1996  [JP]  Japan ................................. 8-237939

[51] Int. Cl.[7] .......................... F25B 21/02; H01L 35/30
[52] U.S. Cl. ............................................................. 62/3.7
[58] Field of Search .......................... 62/3.2, 3.3, 3.7, 62/259.2

[56] References Cited

U.S. PATENT DOCUMENTS

| | | | |
|---|---|---|---|
| 5,183,104 | 2/1993 | Novotny | 165/104.33 |
| 5,349,831 | 9/1994 | Daikoku et al. | 62/376 |
| 5,522,452 | 6/1996 | Mizuno et al. | 165/40 |
| 5,653,111 | 8/1997 | Attey et al. | 62/3.7 |
| 5,687,577 | 11/1997 | Ballard et al. | 62/64 |

*Primary Examiner*—William Doerrler
*Attorney, Agent, or Firm*—Evenson, McKeown, Edwards & Lenahan, PLLC

[57] ABSTRACT

An object of this invention is to provide a thermoelectric apparatus, which is excellent in performance and has sufficiently high thermoelectric conversion ability.

Supply means 6,7 for supplying a liquid heat transfer medium 21 against a side of a substrate with N-type semiconductor layers and P-type semiconductor layers supported thereon, said side being opposite to a semiconductor-layer-supporting side of the substrate, is arranged so that the liquid heat transfer medium 21 strikes against the opposite side of the substrate.

8 Claims, 17 Drawing Sheets

THERMOELECTRIC CONVERTER

TECHNICAL FIELD

This invention relates to a thermoelectric apparatus such as thermoelectric cooling apparatus or thermoionic electricity generator, and especially to a thermoelectric apparatus making use of a fluid, such as water or antifreeze, as a heat transfer medium therefor.

BACKGROUND ART

FIG. 22 and FIG. 23 are drawings for describing a conventional thermoelectric apparatus, in which FIG. 22 is a cross-sectional view of the thermoelectric apparatus and FIG. 23 is a cross-sectional view taking along line X—X of FIG. 22.

As is illustrated in FIG. 22, a group 102 of thermoelectric elements, which are composed of electrodes and P-type and N-type semiconductor layers, is held between a heat-absorbing-side insulating substrate 100 and a heat-dissipating-side insulating substrate 101 both of which are made of ceramics such as alumina.

A heat-absorbing member 103 carrying heat-absorbing fins or the like attached thereto is arranged on an outer surface of the heat-absorbing-side insulating substrate 100. On an outer surface of the heat-dissipating-side insulating substrate 101, a flow-passage-forming member 104 is arranged with openings thereof directed toward the substrate 101. Inside the flow-passage-forming member 104, a continuous flow passage is formed so that water 105 as a heat transfer medium is allowed to tortuously flow along the outer surface of the substrate 101 from an end of the flow-passage-forming member toward an opposite end thereof. A supply pipe 107 is disposed in the vicinity of the one end of the flow-passage-forming member 104, while a drain pipe is arranged in the vicinity of the opposite end of the flow-passage-forming member.

A predetermined current is fed to the thermoelectric element group 102 and, at the same time, the water 105 is caused to flow into the flow-channel-forming member 104 through the supply pipe 107. Heat absorbed by the heat-absorbing member 103 is transferred to the heat-dissipating-side insulating substrate 101 via the heat-absorbing-side insulating substrate 100 an the thermoelectric element group 102. By allowing the water 105 to tortuously flow along the outer surface of the substrate 101, the water absorbs heat from the substrate 101. The water 105 is then discharged out of the system through the drain pipe 108, whereby cooling takes plate on a side of the heat-absorbing member 103.

Its relevant techniques are found, for example, in Japanese Language Laid-Open (Kokai) Publication (PCT) No. HEI 6-504361, Japanese Patent Application Laid-Open (Kokai) No. HEI 5-322366 and Japanese Patent Application Laid-Open (Kokai) No. HEI 5-343750.

Incidentally, these conventional thermoelectric apparatuses are accompanied by a problem in that sufficiently high thermoelectric conversion ability is still unavailable from them.

The present inventors have proceeded with an investigation about this problem. As a result, it has been found that there is a problem especially in the manner of allowing a heat transfer medium to flow through such thermoelectric apparatuses. Described specifically, it has been found that, because a heat transfer medium is allowed to flow simply in a tortuous pattern along a surface of an insulating substrate in each conventional thermoelectric apparatus, the thermal conductance between the heat transfer medium and the insulating substrate is low, thereby failing to obtain any sufficient thermoelectric conversion ability.

An object of the present invention is to overcome such a drawback of the conventional art and hence to provide a thermoelectric apparatus which is excellent in performance and has sufficiently high thermoelectric conversion ability.

DISCLOSURE OF THE INVENTION

To achieve the above object, the invention of claim 1 is characterized in that supply means, which is provided, for example, with a distributing member or the like, is arranged to supply a liquid heat transfer medium such as water or antifreeze so that the liquid heat medium strikes, for example, at a substantially right angle, against a side of a substrate carrying N-type semiconductor layers and P-type semiconductor layers supported thereon and composed, for example, of a metal plate having an electrically insulating thin film thereon, said side being opposite to a semiconductor-layer-supporting side of the substrate.

The invention of claim 2 is characterized in that, in a thermoelectric apparatus according to claim 1, the substrate is a metal substrate provided on the semiconductor-layer-supporting side thereof with an electrically insulating thin film.

The invention of claim 3 is characterized in that, in a thermoelectric apparatus according to claim 1, a space extending over substantially an entire area of the substrate is formed on a substrate-opposing side of the supply means, and the liquid heat transfer medium which has struck against the side of the substrate is allowed to spread within the space.

The invention of claim 4 is characterized in that, in a thermoelectric apparatus according to claim 1, the supply means is provided, on a striking path of the heat transfer medium, with a flattened first space, a plurality of spouting holes, and a flattened second space extending over substantially an entire area of the substrate so that the first space, the spouting holes and the third space are communicated together from an upstream side toward a downstream side; and the liquid heat transfer medium which has flowed in the first space is spouted in a distributed state toward the side of the opposite substrate through the individual spouting holes, and the liquid heat transfer medium which has struck against the opposite side of the substrate is allowed to spread within the second space.

The invention of claim 5 is characterized in that, in a thermoelectric apparatus according to claim 1, the supply means is constructed so that the liquid heat transfer medium strikes against the opposite side of the substrate at substantially a right angle.

The invention of claim 6 is characterized in that, in a thermoelectric apparatus according to claim 1, the supply means is provided with a number of spouting nozzles which extend close to the opposite side of the substrate.

The invention of claim 7 is characterized in that, in a thermoelectric apparatus according to claim 1, concavities and convexities against which the liquid heat transfer medium strikes are formed at the opposite side of the substrate.

The invention of claim 8 is characterized in that, in a thermoelectric apparatus according to claim 7, the concavities and convexities are formed opposite a spouting hole of the supply means.

The invention of claim 9 is characterized in that a substrate, on which N-type semiconductor layers and P-type semiconductor layers are supported, and a distributing member, which is provided with a number of spouting nozzles with spouting holes formed therethrough for spouting a liquid heat transfer medium against a side of the substrate, said side being opposite to a semiconductor-layer-supporting side of the substrate, are arranged opposite to each other; and escape recesses are arranged in the vicinity of the spouting nozzles of the distributing member so that the liquid heat transfer medium spouted against the opposite side of the substrate is allowed to escape from the opposite side.

The invention of claim 10 is characterized in that, in a thermoelectric apparatus according to claim 9, a number of concavities and convexities are formed at the opposite side of the substrate.

BEST MODES FOR CARRYING OUT THE INVENTION

Figure 1:
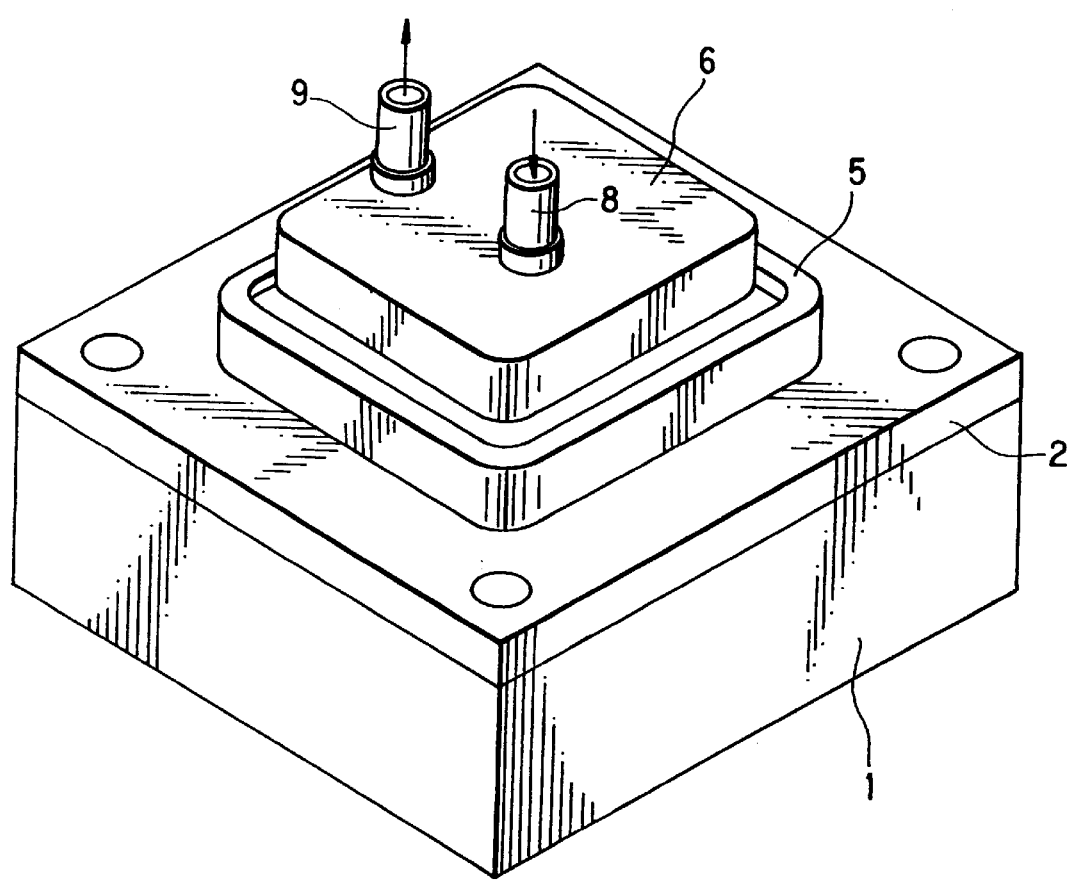
FIG. 1 is a perspective view of a thermoelectric apparatus according to a first embodiment of the present invention.

In each conventional thermoelectric apparatus, a liquid heat transfer medium is allowed to flow along a surface of a base plate (substrate) to effect a transfer of heat between the base plate and the liquid heat transfer medium. In the present invention, on the other hand, a liquid heat transfer medium is caused to strike against a surface of a base plate so that the liquid heat transfer medium is ensured to be brought into contact with the base plate in a state of a turbulent flow. This makes it possible to efficiently conduct a transfer of heat and, as a consequence, the heat-exchanging ability of the apparatus as whole is increased.

Before describing the specific embodiments of the present invention, a description will be made about the present inventors' general finding on improvements in the performance of such a thermoelectric apparatus making use of a heat transfer medium.

As measures for improving the performance of a thermoelectric apparatus of the above-mentioned type, the following approaches and the like can be mentioned:

[I] To lower the thermal resistance of a substrate, and

[II] To improve the manner of allowing a heat transfer medium to flow.

(i) As means effective for lowering the thermal resistance of a substrate as the former measure, a metal substrate having an insulating thin film, like an aluminum substrate provided with a layer of low thermal resistance, for example, an anodized alumina film may be used instead of a conventional insulating substrate made of ceramics such as alumina. Described specifically, an anodized alumina film may be formed on a surface of an aluminum substrate by anodization. As an alternative, aluminum may be thermally sprayed onto a surface of an aluminum substrate and may then be converted into an anodized alumina layer.

A problem of reliability however arises if a substrate having a thickness as large as a heat-absorbing-side substrate is also used as a heat-dissipating-side substrate, because a metal substrate undergoes expansion or shrinkage at a much greater rate by heat than a ceramic substrate and, due to the resulting thermal stress, the shear stress increases in the system of the heat-dissipating-side-substrate—heat-dissipating-side electrodes—P,N semiconductor layers—heat-absorbing side electrodes—heat-absorbing-side substrate.

(ii) To overcome the above-mentioned problem, one of the substrates (for example, a heat-absorbing-side substrate) may be formed thick like ordinary substrates but the other substrate (for example, a heat-dissipating-side substrate) may be rendered significantly thinner than the heat-absorbing-side substrate. In other words, a difference may be provided in thickness between a heat-dissipating-side substrate and a heat-absorbing-side substrate. This makes it possible to allow the heat-dissipating-side substrate to follow thermal deformations of the heat-absorbing-side substrate, whereby the occurrence of thermal stress can be reduced in the above-mentioned system.

However, the adoption of the thin substrate involves a potential problem in that the thermal resistance may conversely increase when the occupation density of the P and N semiconductor layers (the percentage of the sum of cross-sectional areas of the P and N semiconductor layers relative to the total area of the substrate) is small.

(iii) To cope with this potential problem, it may be contemplated to reduce the increase in thermal resistance when the occupation density of the P and N semiconductor layers is small. This can be done by relatively increasing the area of electrodes and keeping an effective heat transfer area while leaving the thin substrate as is.

Concerning the manner of allowing the heat transfer medium to flow, on the other hand, it is necessary to make an improvement so that, when the thermoelectric apparatus is taken as a whole system, high heat-exchanging ability can be obtained, for example, by supplying smaller electric power for moving the medium.

(iv) As a means for obtaining high heat-exchanging ability, it is advisable to increase the effective heat transfer area by making a structural improvement.

(v) As another means for obtaining high heat-exchanging ability, it may also be contemplated to increase the coefficient of heat transfer. When the electric power for moving the medium is maintained constant, it is advisable to reduce the flow pressure loss of the heat transfer medium in a flow passage and at the same time, to increase the flow rate of the heat transfer medium, in other words, the quantity of heat to be transferred. The present invention primarily pertains to the technique (v).

Figure 3:
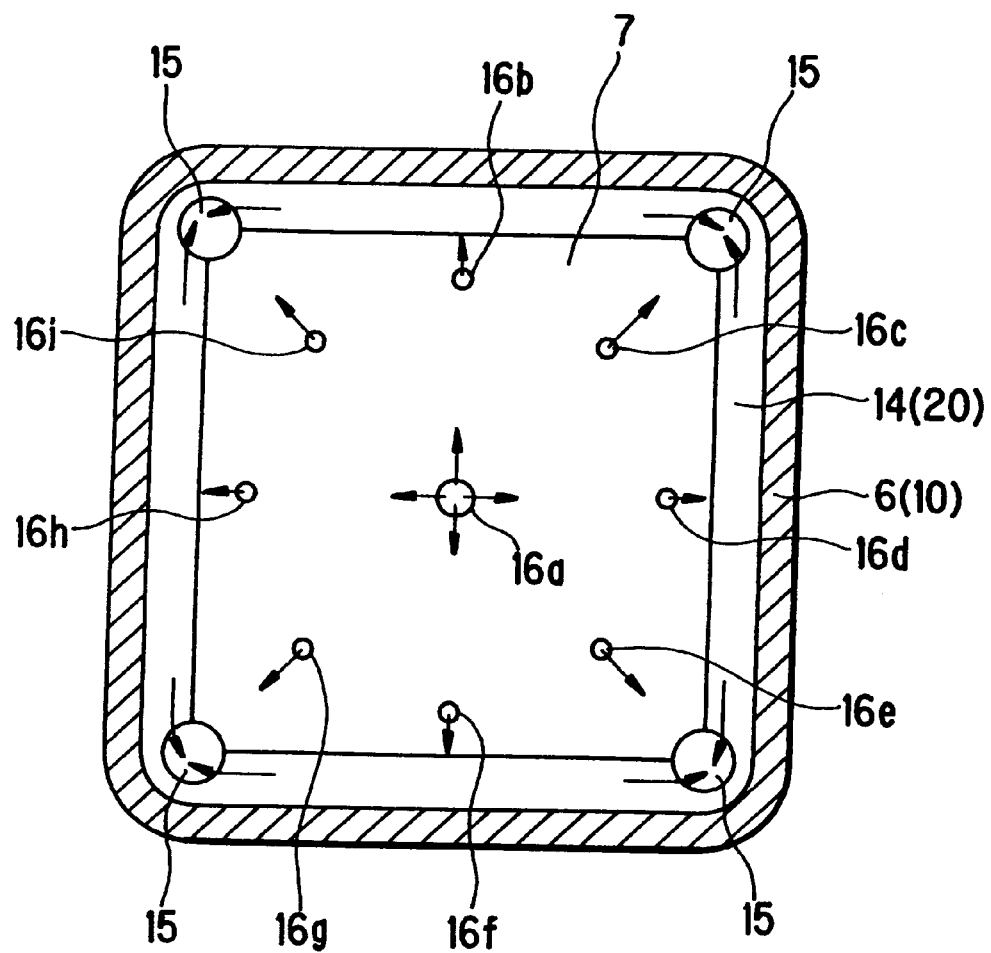
FIG. 3 is a cross-sectional view taken along line A—A of FIG. 2.
Figure 4:
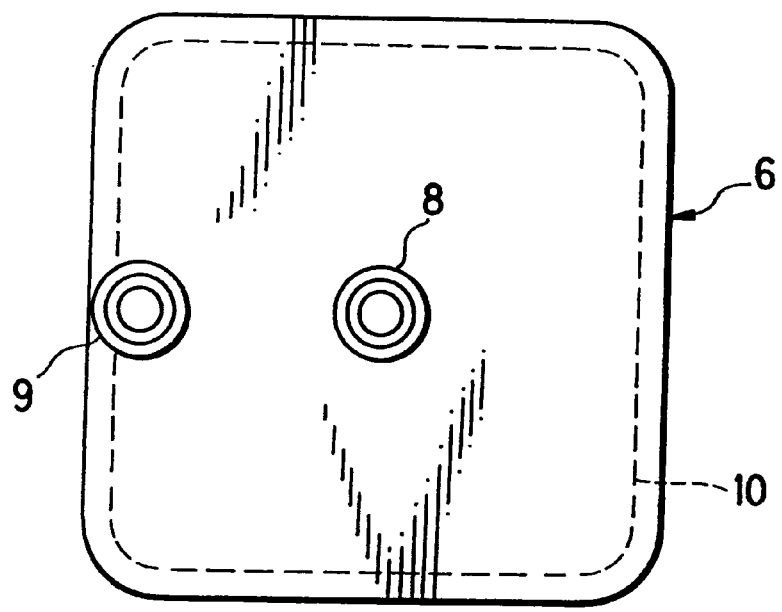
FIG. 4 is a plan view of a cover member employed in the thermoelectric apparatus.
Figure 5:
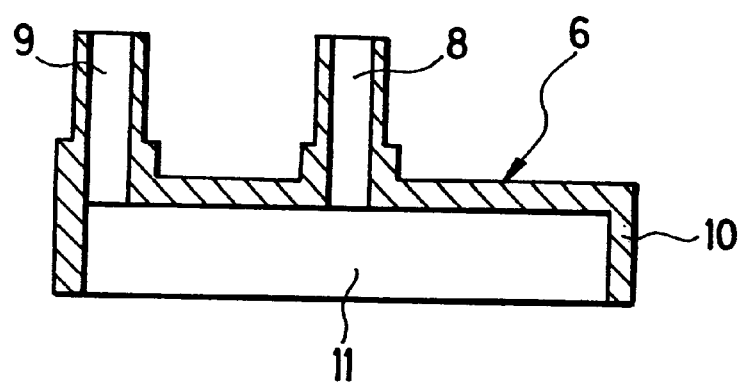
FIG. 5 is a cross-sectional view of the cover member.
Figure 6:
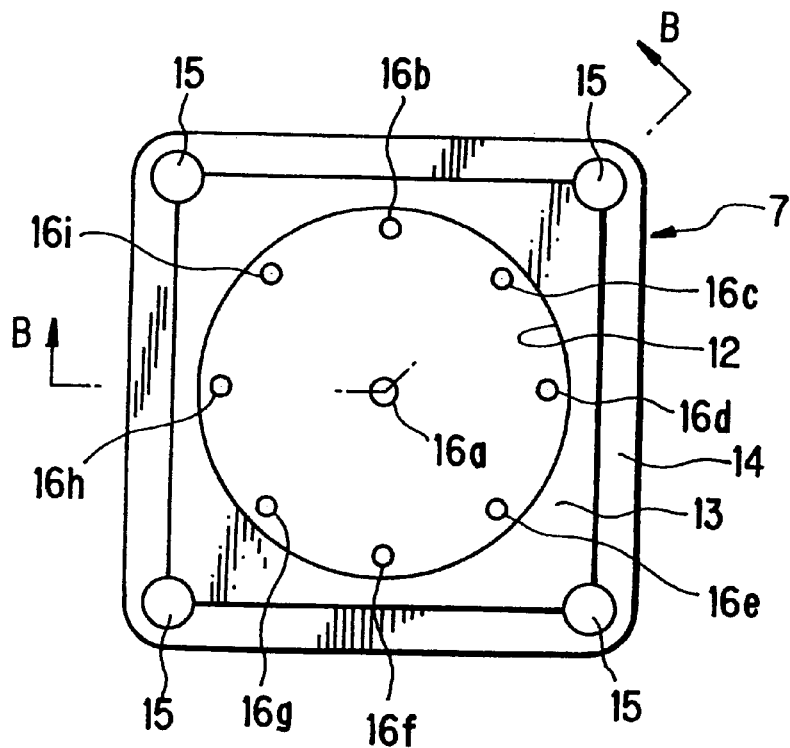
FIG. 6 is a plan view of a distributing member used in the thermoelectric apparatus.
Figure 7:
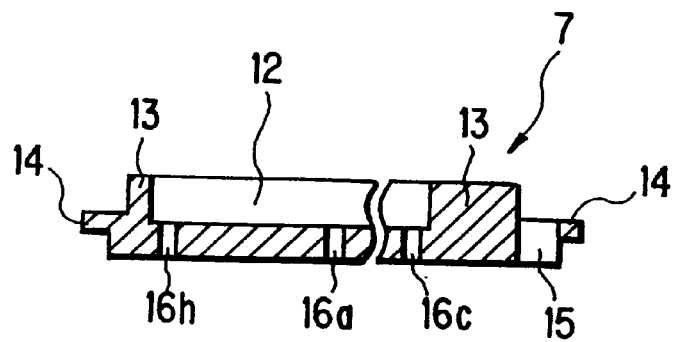
FIG. 7 is a cross-sectional view taken along line B—B of FIG. 6.

The embodiments of the present invention will next be described with reference to the drawings. FIG. 1 is the perspective view of the thermoelectric apparatus which can be used, for example, as a thermoelectric cooling apparatus for a refrigerator, freezer, cold storage or the like, FIG. 2 is the cross-sectional view of the thermoelectric apparatus, FIG. 3 is the cross-sectional view taken along line A—A of FIG. 2, FIG. 4 and FIG. 5 are the plan view and cross-sectional view of the cover member, respectively, FIG. 6 is a plan view of the distributing member, and FIG. 7 is the cross-sectional view taken along line B—B of FIG. 6.

Figure 2:
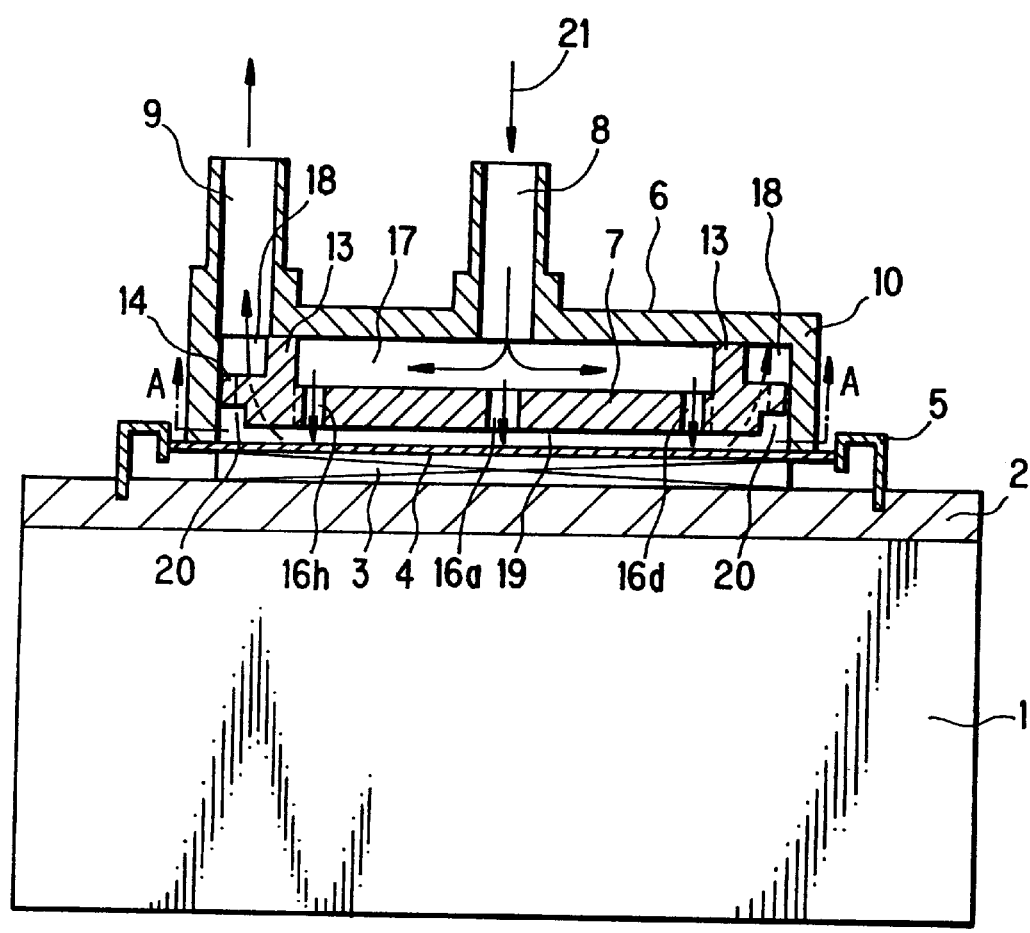
FIG. 2 is a vertical cross-sectional view of the thermoelectric apparatus.

As is depicted in FIG. 1 and FIG. 2, the thermoelectric apparatus is constructed primarily of a heat-absorbing member 1 adapted to be arranged in contact with a cooled side, a heat-absorbing-side substrate 2, a thermoelectric element group 3 (see FIG. 2), a heat-dissipating-side substrate 4 (see FIG. 2), a support frame 5, a cover member 6, and a distributing member 7 (see FIG. 2).

Although not illustrated in the drawings, the heat-absorbing member 1 is, for example, in the form of a container and, if necessary, may be internally provided with a number of heat-absorbing fins and a fan.

The heat-absorbing-side substrate 2 and the heat-dissipating-side substrate 4 are both made of metal plates such as aluminum plates and, on surfaces in contact with the thermoelectric element group 3, are provided electrically insulating thin films such as anodized alumina films. When insulating films of anodized alumina are formed by anodization, the insulating thin films, without sealing treatment, can exhibit better joinability with the thermoelectric element group 3. As an alternative, the electrically insulating films can also be formed by thermal spraying or the like.

As is illustrated in FIG. 2, the heat-absorbing-side substrate 2 and the heat-dissipating-side substrate 4 are different in thickness (in this embodiment, the thickness of the heat-absorbing-side substrate 2: 5 mm, the thickness of the heat-dissipating-side substrate 4: 0.2 mm; there is hence a thickness relationship of the heat-absorbing-side substrate 2>the heat-dissipating-side substrate 4), so that the substrate having the smaller thickness can sufficiently follow thermal shrinkage (thermal expansion) of the substrate having the greater thickness. This has brought about a reduction in the occurrence of thermal stress in the heat-absorbing-side substrate 2—the thermoelectric element group 3—the heat-dissipating-side substrate 4.

As is well known, the thermoelectric element group 3 is composed of heat-absorbing-side electrodes, heat-dissipating-side electrodes, and a number of P-type semiconductor layers and N-type semiconductor layers arranged between both the electrodes, although not illustrated in the drawings. Structurally and thermally, the P-type semiconductor layers and the N-type semiconductor layers are arranged in parallel with each other but, electrically, they are connected together in series via the above-mentioned electrodes. This thermoelectric element group 3 may be of a single-stage structure or of a multistage cascaded structure.

The support frame 5 is molded of a synthetic resin and supports thereon the heat-dissipating-side substrate 4. It is attached at a basal end thereof to the heat-absorbing-side substrate 2.

The cover member 6 is molded of a synthetic resin and, as is shown in FIG. 5, is integrally provided with a supply pipe 8 and a drain pipe 9 both of which extend in a vertical direction. The supply pipe 8 is arranged at a substantially central part of the cover member 6, while the drain pipe 9 is disposed adjacent a peripheral edge of the cover member 6. The cover member 6 is provided in a lower half thereof with a peripheral wall 10 which is open downwardly. Inside the peripheral wall, there is formed a space 11 within which the distributing member 7 is arranged.

The distributing member 7 is also molded of a synthetic resin. As is depicted in FIG. 6, a circular recess 12 is formed approximately centrally in an upper surface of the distributing member, and a wall portion 13 is arranged so that the recess is surrounded by the wall portion. The distributing member 7 is provided, on an outer periphery thereof and at a substantially intermediate position as viewed in the direction of its thickness, with a flange portion 14. Drain holes 15 of a relatively large diameter are formed in four corners of the flange portion 14.

Vertically-extending spouting holes 16a–16i are arranged, one at a central part of the recess 12 and eight at equal intervals at an outer peripheral portion of the recess. The spouting hole 16a at the central part has a diameter somewhat greater than the remaining spouting holes 16b–16i.

As is shown in FIG. 2, the distributing member 7 has been positioned within the cover member 6 by inserting the distributing member 7 into the cover member 6 and then bonding an upper surface of the wall portion 13 of the distributing member 7 to an inner wall of the cover member 6 and an outer peripheral surface of the flange portion 14 of the distributing member 7 to an inner surface of the peripheral wall 10 of the cover member 6, respectively. Further, a flattened first space 17 is formed between the inner wall of the cover member 6 and the upper wall of the distributing member 7 and, in communication with the drain pipe 9, a drain channel 18 in the form of a square frame is also formed at a position surrounded by the peripheral wall 10, the wall portion 13 and the flange portion 14.

By bonding a lower surface of the peripheral wall 10 of the cover member 6 to the heat-dissipating-side substrate 4, a flattened narrow second space 19 of a height of about 1 to 3 mm is formed between the lower wall of the distributing member 7 and the upper wall of the heat-dissipating-side substrate 4 and, around the flattened second space, a collecting channel 20 is also formed in communication with the drain holes 15 in the four corners.

As is illustrated in FIG. 2, when water 21 is supplied as a heat transfer medium through the central supply pipe 8, the water is allowed to instantaneously spread out within the first space 17 and is vigorously spouted out in a substantially vertical direction toward an upward surface and a plane of the heat-dissipating-side substrate 4 through the respective nine spouting holes 16a–16i. The water 21, which has struck against the heat-dissipating-side substrate 4 and has absorbed heat from the heat-dissipating-side substrate 4, is allowed to spread out within the narrow second space 19, is collected in the surrounding collecting channel 20, and is then discharged out of the system through the drain pipe 9 by way of the nearby drain holes 15 and the drain channel 18. The water 21 so discharged is cooled in an unillustrated radiator or by self-cooling and is used again through a recirculation system.

Figure 8:
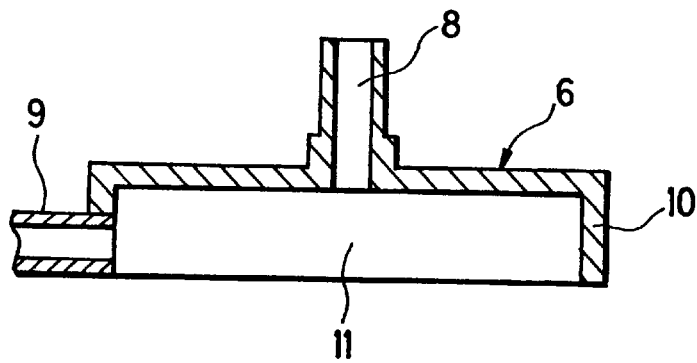
FIG. 8 is a cross-sectional view of a cover member associated with a second embodiment of the present invention.

FIG. 8 is the drawing which illustrates the second embodiment. In this embodiment, a drain pipe 9 is arranged at a peripheral wall 10 of a cover member 6, and water collected in the collecting channel 20 (see FIG. 2) is directly discharged through the drain pipe.

Figure 9:
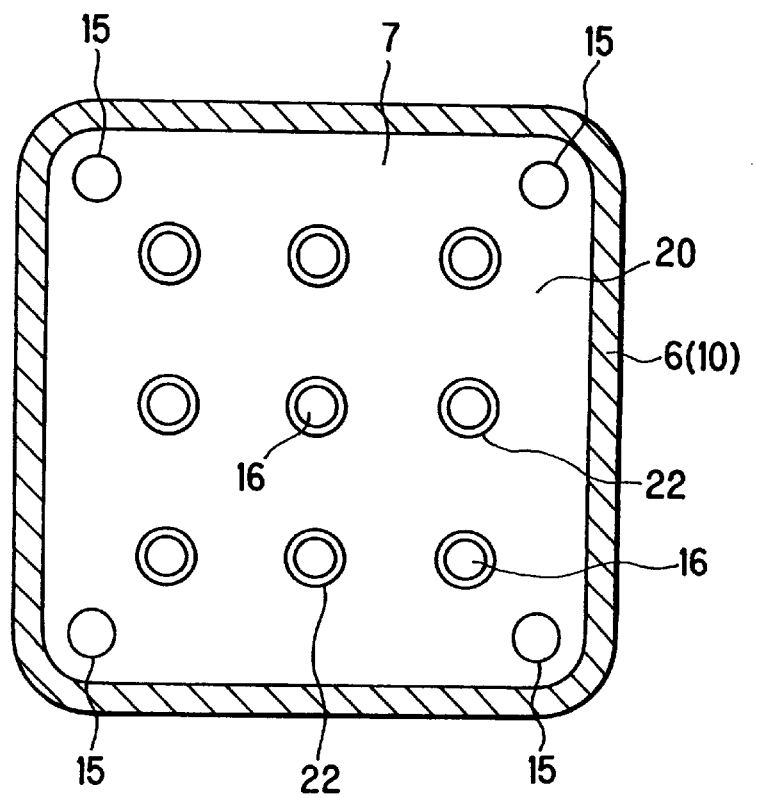
FIG. 9 is a bottom view of a thermoelectric apparatus according to a third embodiment of the present invention, in which a part of the thermoelectric apparatus is shown in cross-section.

FIG. 9 is the drawing which shows the third embodiment. In this embodiment, a number of pipes 22 are integrally arranged on a lower wall of a distributing member 7. Holes of the pipes 22 serve as spouting holes 16. Further, spaces between the pipes 22 serve as a collecting channel 20.

Figure 10:
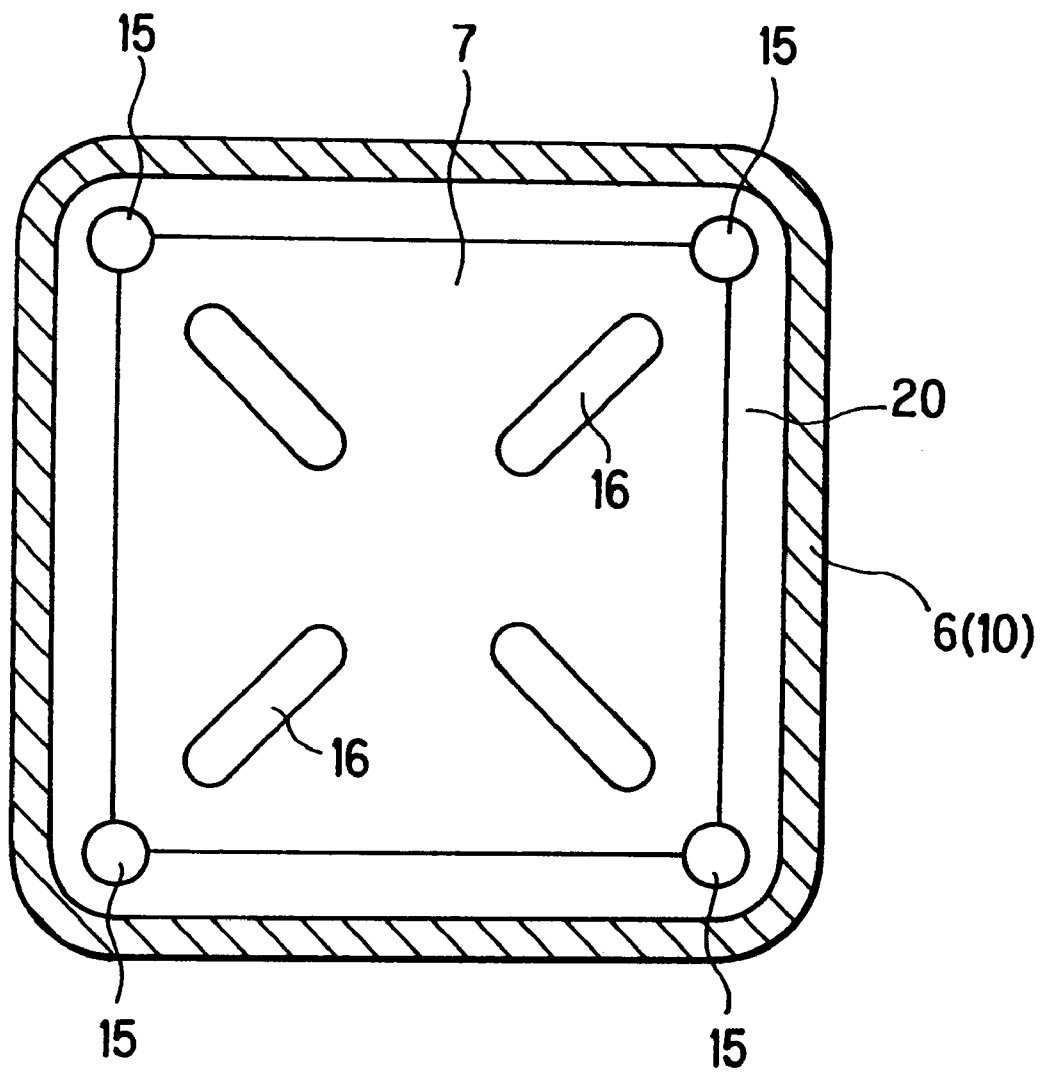
FIG. 10 is a bottom view of a thermoelectric apparatus according to a fourth embodiment of the present invention, in which a part of the thermoelectric apparatus is shown in cross-section.

FIG. 10 is the drawing which depicts the fourth embodiment. In this embodiment, plural slit-like spouting holes 16 are arranged extending from a side of a central part of a distributing member 7 toward a surrounding collecting channel 20.

Figure 11:
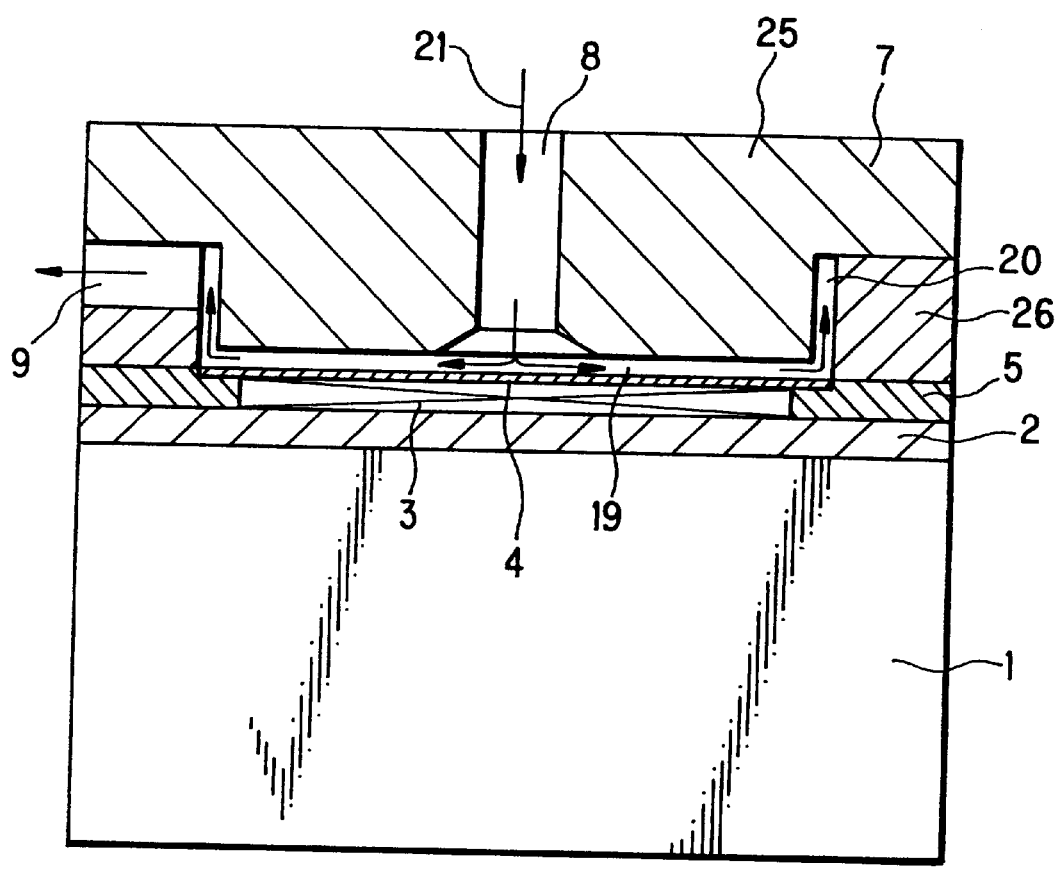
FIG. 11 is a cross-sectional view of a thermoelectric apparatus according to a fifth embodiment of the present invention.

FIG. 11 is the drawing which illustrates the fifth embodiment. In this embodiment, a distributing member 7 is composed in combination of an upper member 25, which is provided through a central part thereof with a vertically-extending supply pipe 8, and a lower member 26 provided with a drain pipe 9.

Between the upper member 25 and a heat-dissipating substrate 4, a flattened narrow second space 19 is formed, and a collecting channel 20 is formed between a raised central portion of the upper member 25 and an inner periphery of the lower member 26.

Figure 12:
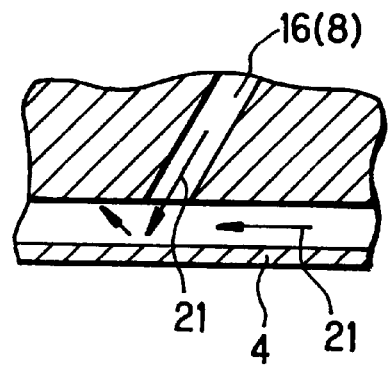
FIG. 12 is an enlarged fragmentary cross-sectional view of a spouting hole (water supply pipe portion) of a thermoelectric apparatus according to a sixth embodiment of the present invention.

FIG. 12 is the drawing which shows the sixth embodiment. In each of the above-described embodiments, the spouting-holes 16 or the supply pipe 8 was arranged at a substantially right angle relative to the plane of the heat-dissipating-side substrate 4. In this embodiment, however, spouting holes 16 or a supply pipe 8 is arranged in a direction inclined relative to a plane of a heat-dissipating-side substrate 4. Owing to this inclination, the flowing direction of water 21 is remains unchanged and the water 21 is allowed to flow smoothly, thereby contributing to a reduction in the pressure loss.

Figure 13:
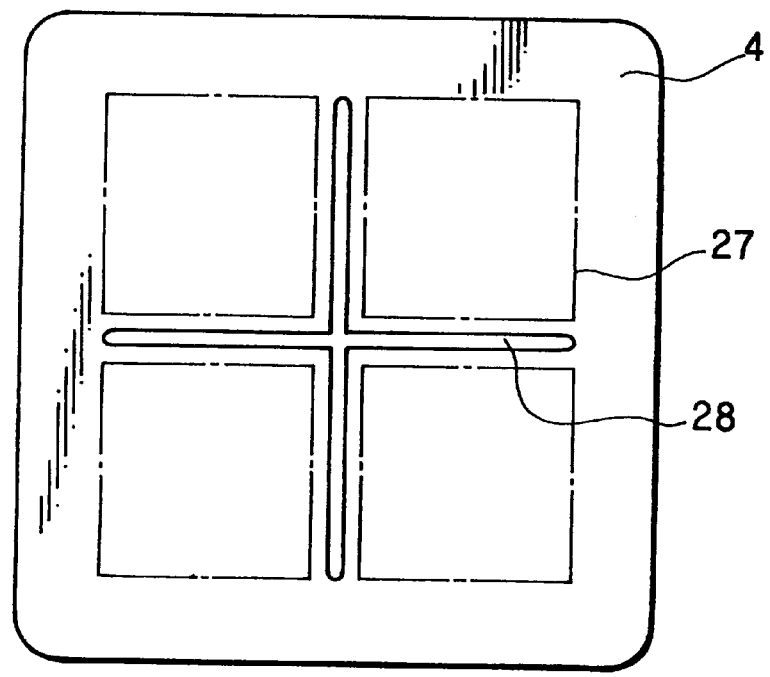
FIG. 13 is a plan view of a heat-dissipating-side substrate for use in a thermoelectric apparatus according to a seventh embodiment of the present invention.
Figure 14:
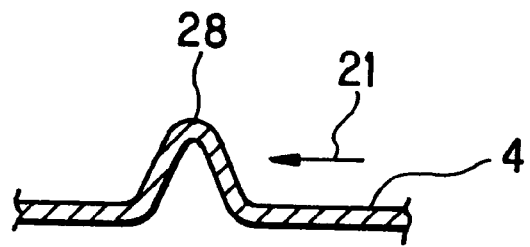
FIG. 14 is an enlarged fragmentary cross-sectional view of the heat-dissipating-side substrate.

FIG. 13 and FIG. 14 are drawings which depict the 9-seventh embodiment. In this embodiment, mounting areas 27 for the thermoelectric element group 3 on the heat-dissipating-side substrate 4 are as four sections divided about a central part of the heat-dissipating-side substrate 4 as a base point, and bent portions 28 of a chevron shape in cross-section are formed between the individual mounting areas 27. Each bent portion 28 may extend continuously in the form of a rib as shown in the drawing or may be in an interrupted form. Further, the bent portions 29 may protrude toward the thermoelectric element group 3 or, conversely, toward a side opposite to the thermoelectric element group 3. Although the bent portions 28 are formed crosswise in this embodiment, a greater number of bent portions 28 can be formed.

Figure 15:
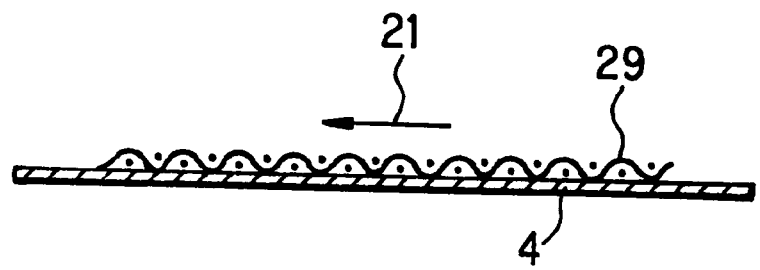
FIG. 15 is a cross-sectional view of the heat-dissipating-side substrate for use in a thermoelectric apparatus according to an eighth embodiment of the present invention.

FIG. 15 is the drawing which shows the eighth embodiment. In this embodiment, a thin porous thermal conductor 29 having a high rate of open area, such as a wire net, an expanded metal or a punching metal, is attached by spot welding or the like to a side of a heat-dissipating-side substrate 4, said side being on a side opposite to a mounting side for the thermoelectric element group 3.

Owing to the formation of the bent portions 28 on the heat-dissipating-side substrate 4 or the attachment of the porous thermal conductor as in the seventh embodiment or the eighth embodiment, a flow of water 21 in the vicinity of the surface of the heat-dissipating-side substrate 4 takes the form of a turbulent flow so that the heat-absorbing efficiency of the water 21 for the heat-dissipating-side substrate 4 becomes high.

Incidentally, neither the bent portions 28 nor the porous thermal conductor 29 extends to a sealing portion which is formed on and along the periphery of the heat-dissipating-side substrate 4.

Figure 16:
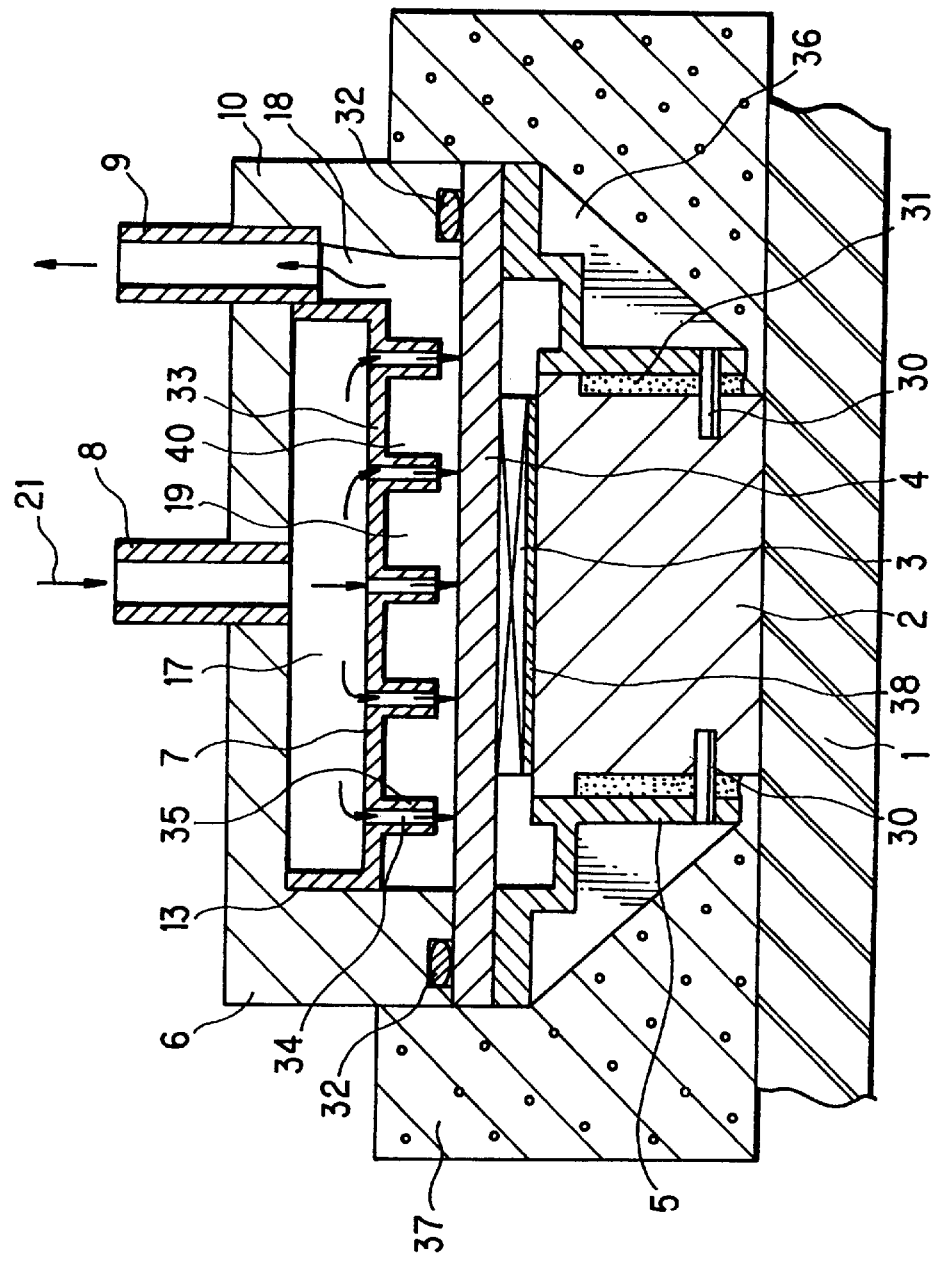
FIG. 16 is a cross-sectional view of a thermoelectric apparatus according to a ninth embodiment of the present invention.
Figure 17:
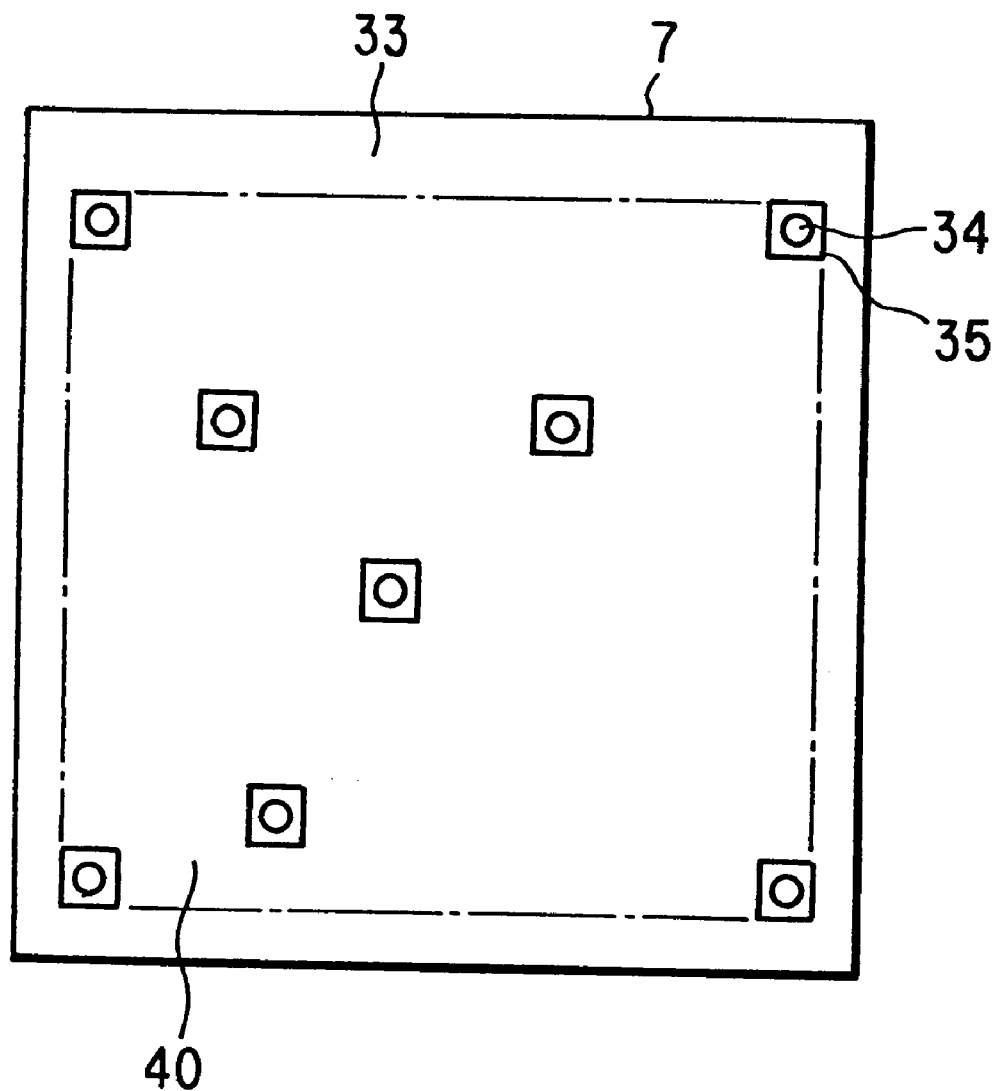
FIG. 17 is a bottom view of a distributing member for use in the thermoelectric apparatus.

FIG. 16 and FIG. 17 are drawings which illustrate the ninth embodiment, in which FIG. 16 is the cross-sectional view of the thermoelectric apparatus and FIG. 17 is the bottom view of the distributing member. A support frame 5 supports thereon a heat-dissipating-side substrate 4 and, on a basal end thereof, is positioned on a heat-absorbing-Bide substrate 2 by pins 30 and is fixed there by an adhesive 31.

A cover member 6 is provided with a peripheral wall 10 which is open in a downward direction. Inside the peripheral wall, a distributing member 7 is arranged. The peripheral wall 10 is bonded at a lower end thereof to a periphery of the heat-dissipating-side substrate 4 in a liquid-tight fashion with an O-ring 32 interposed therebetween.

From a bottom wall portion 33 of the distributing member 7, many spouting nozzles 35 having spouting holes 34 therethrough extend downwards at equal intervals therebetween, and escape recesses 40 are formed around the respective spouting nozzles 35. These escape recesses 40 are in communication with each other and are also connected to a drain channel 18. Incidentally, most of the spouting holes 34 and spouting nozzles 35 are omitted in FIG. 17 because the drawing would become complex if they were all included.

By mounting the distributing member 7 within the cover member 6, there are formed a flattened first space 17 between the cover member 6 and the distributing member 7, a flattened second space 19 between the distributing member 7 and the heat-dissipating-side substrate 4, and a drain channel 18 on an outer side of the distributing member 7. Further, lower ends of the spouting nozzles 35 extend close to the surface of the heat-dissipating-side substrate 4 so that the clearances between the spouting nozzles 35 and the heat-dissipating-side substrate 4 are as narrow as about 1 to 3 mm or so.

When water 21 is supplied as a heat transfer medium through a central supply pipe 8, the water 21 is allowed to instantaneously spread within the first space 17 and is vigorously spouted out in a substantially vertical direction toward the upper surface and of the heat-dissipating-side substrate 4 through the respective spouting nozzles 35. The water 21, which has struck against the heat-dissipating-side substrate 4 and has absorbed heat from the heat-dissipating-side substrate 4, immediately moves toward the escape recesses 40 and separates from the surface of the heat-dissipating-side base 4 owing to repulsive force produced as a result of the striking, and fresh water 21 of low temperature then strikes against the heat-dissipating-side substrate 4. This operation is continuously repeated. The water 21 with the heat absorbed therein is collected in a drain channel 18 by way of the escape recesses 40 and is then discharged out of the system through the drain pipe 9. The water 21 is used again subsequent to cooling.

Incidentally, the numeral 36 in the drawing indicates reinforcing ribs arranged integrally on the support frame 5, the numeral 37 designates a heat-insulating layer, and the numeral 38 identifies a thin film interposed between the heat-absorbing-side substrate 2 and the thermoelectric element group 3, having a high thermal conductivity and made of a filler-mixed silicone resin or the like.

Figure 18:
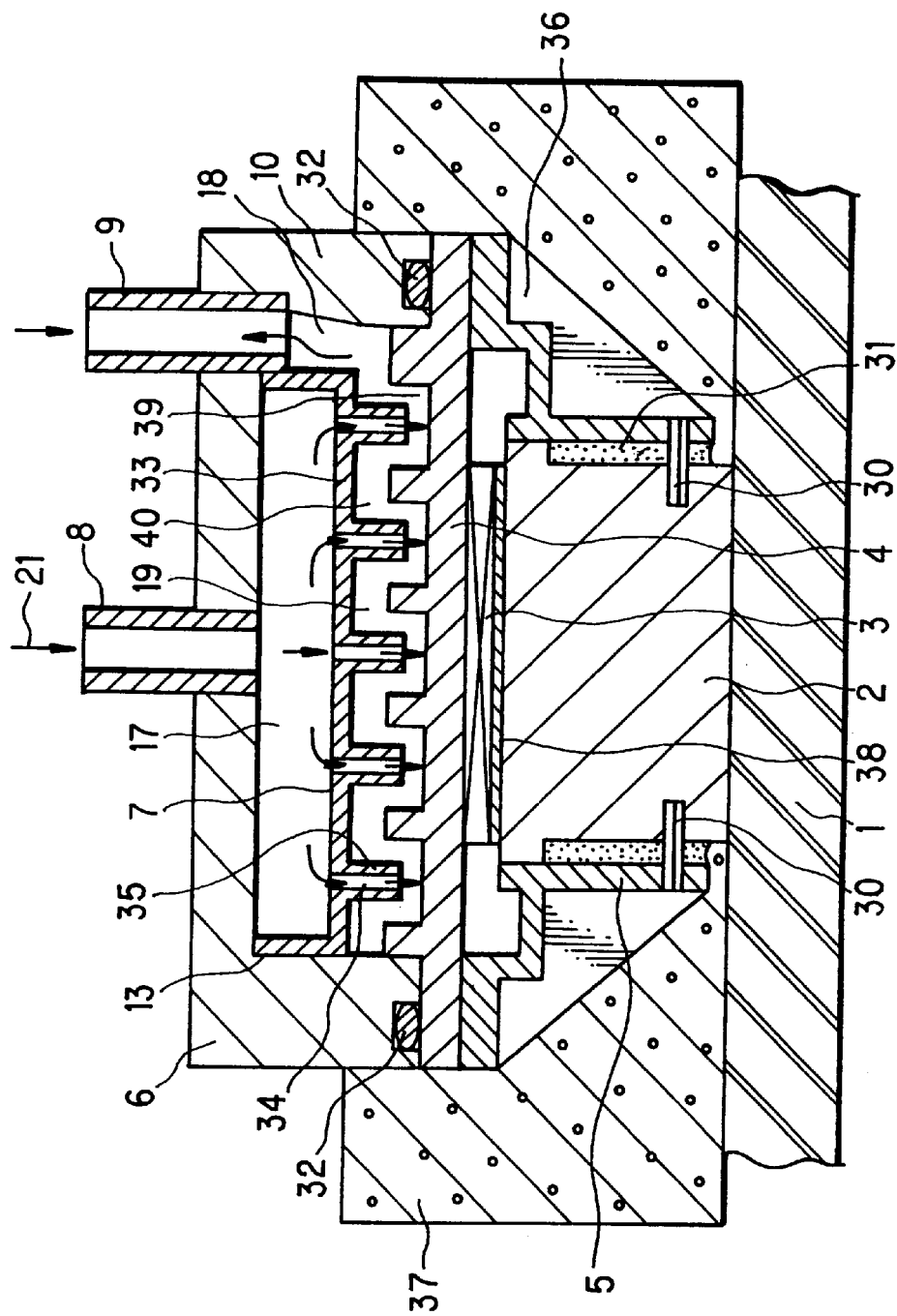
FIG. 18 is a cross-sectional view of a thermoelectric apparatus according to a tenth embodiment of the present invention.
Figure 19:
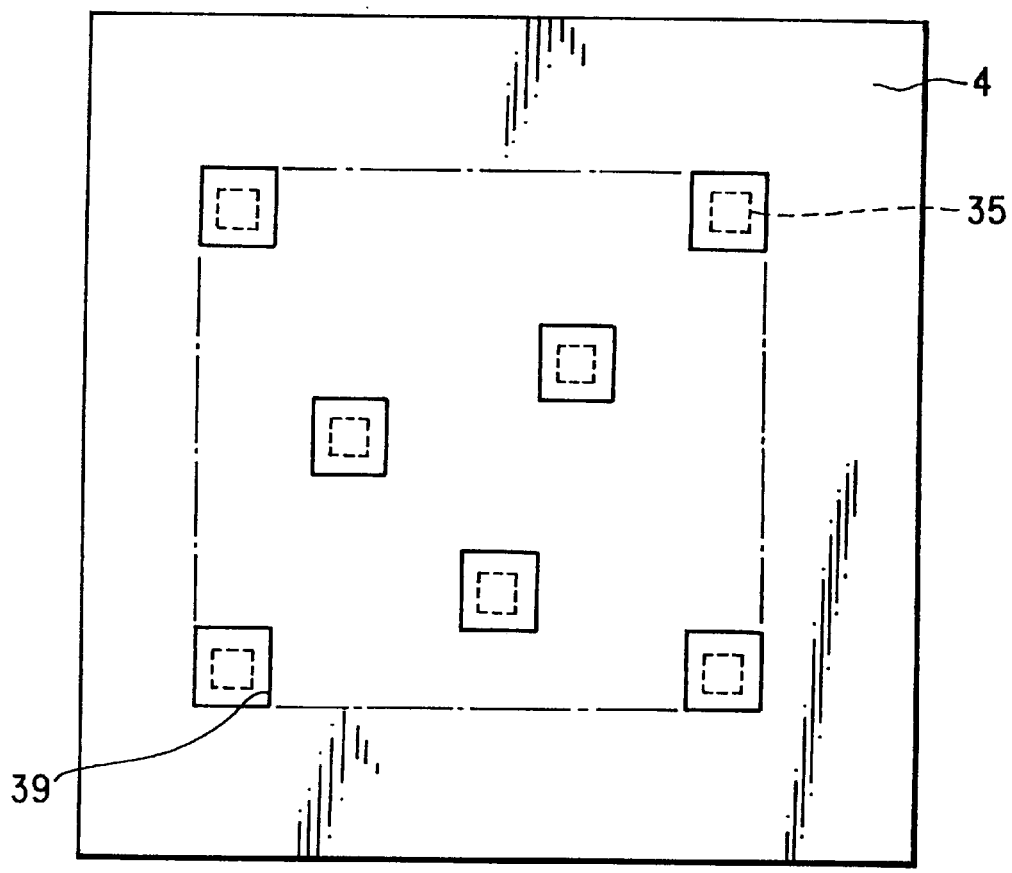
FIG. 19 is a plan view of a heat-dissipating-side substrate for use in the thermoelectric apparatus.

FIG. 18 and FIG. 19 are drawings which depict the tenth embodiment, in which FIG. 18 is the cross-sectional view of the thermoelectric apparatus and FIG. 19 is the plan view of the heat-dissipating-side substrate 4. This embodiment is different from the above-described ninth embodiment in that, as is illustrated in FIG. 18, many concavities and convexities 39 are integrally formed at a surface of the heat-dissipating-side substrate 4 and spouting nozzles 35 of a distributing member 7 are arranged opposite the individual concavities and convexities 39. Incidentally, the concavities and the spouting nozzles 35 arranged opposite thereto are mostly omitted in FIG. 19 because the drawing would become complex if they were Although the concavities are in a form independent from each other in the concavities and convexities 39 according to this invention, it is also possible to arrange many groove-shaped concavities and to insert tip portions of plural spouting nozzles 35 into each of the groove-shaped concavities. Whichever arrangement is selected, the water 21 spouted out of the nozzles 35 can effectively absorb heat from the heat-dissipating-side substrate 4 while striking against the concavities and convexities 39 and being broken there.

Figure 20:
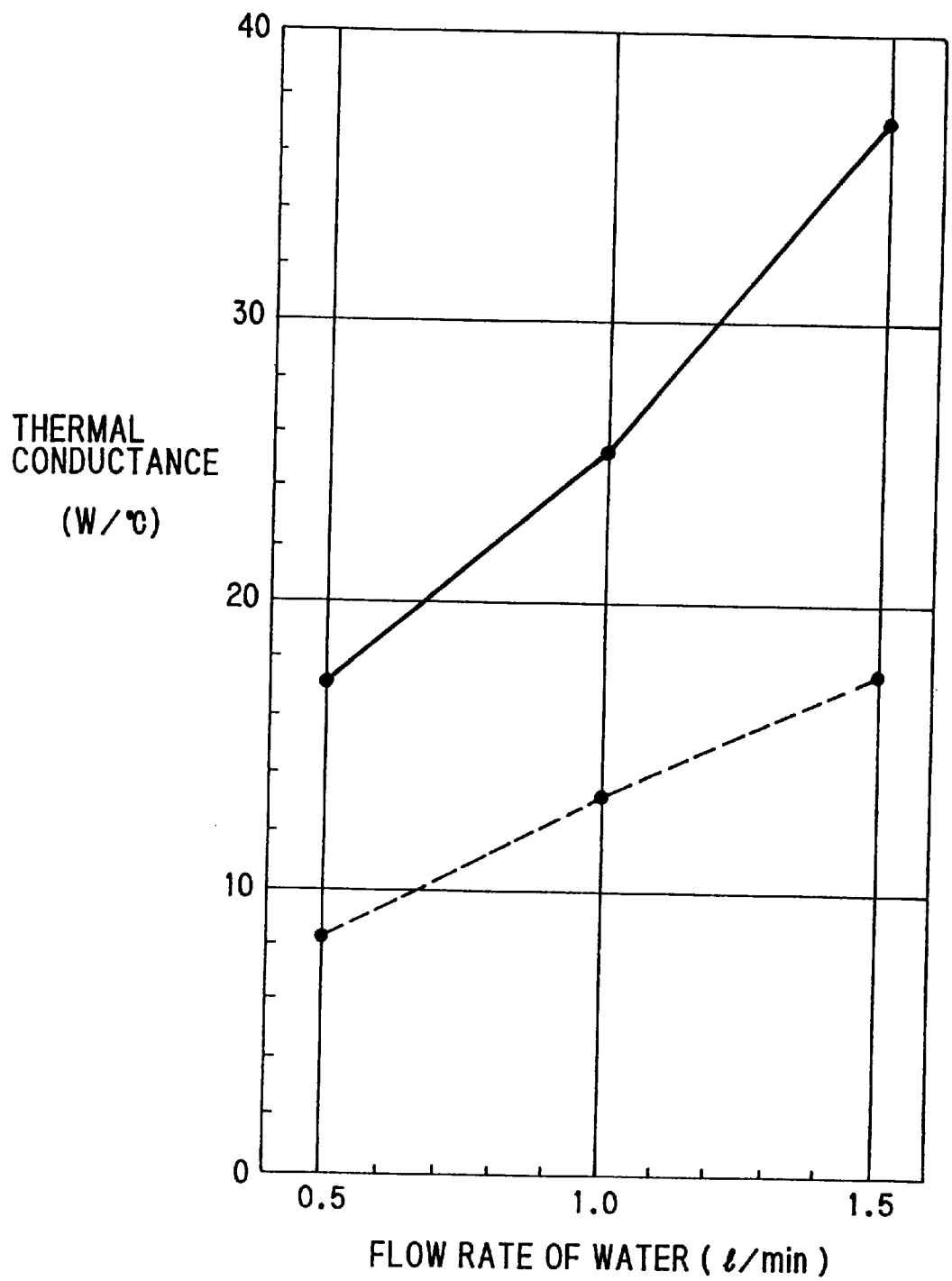
FIG. 20 is a characteristic diagram showing relationships between flow rates of water and thermal conductance in the thermoelectric apparatuses according to the ninth and tenth embodiments of the present invention.

The relationships between the flow rate of the water 21 and thermal conductance in a thermoelectric apparatus (broken line) making use of a heat-dissipating-side substrate 4 a surface of which is flat as shown in FIG. 16 and a thermoelectric apparatus (solid line) making use of a heat-dissipating-side substrate 4 which has many concavities and convexities 39 on a surface thereof as shown in FIG. 18 are shown in FIG. 20.

In each of the apparatuses, the diameter of spouting holes was set at 1.2 mm, the number of the spouting holes was set at 24, and the clearance between, the spouting nozzles 35 and the heat-dissipating-side substrate 4 was set at 2 mm. Further, the thermal conductance hA was determined in accordance with the following formula:

$$hA = Q/\{T_j - (T_{in}+T_{out})/2\}[W/°C.]$$

where

Q: calorific value: (supplied electric power)
$T_j$: temperature of the substrate
$T_{in}$: temperature of the water at the inlet
$T_{out}$: temperature of the water at the outlet As is clearly envisaged from the diagram, the thermal conductance becomes higher in both the apparatuses when the flow rate of the water 21, which is caused to strike against the heat-dissipating-side substrate 4, is increased. It is understood especially that the thermoelectric apparatus (solid line) making use of the heat-dissipating-side substrate 4 with the many concavities and convexities 39 arranged at the surface thereof has a higher thermal conductance and is superior in performance.

Although water was used as a heat transfer medium in the above-described embodiments, the present invention is not limited to the use of water. A liquid other than water, such as antifreeze, can also be used.

The metal-made substrates were used in each of the above-described embodiments. This invention is however not limited to the use of such metal-made substrates, and ceramics such as alumina, aluminum nitride or the like can also be used.

In each of the above-described embodiments, the description was made about the case that the heat transfer medium was brought into contact with the heat-dissipating-side substrate. Based on the above-described embodiments, it is also possible to bring a heat transfer medium into contact with a heat-absorbing-side substrate.

In each of the above-described embodiments, the description was made about the case of the thermoelectric cooling apparatus. However, the present invention can also be applied to thermoionic electricity generators.

Figure 21:
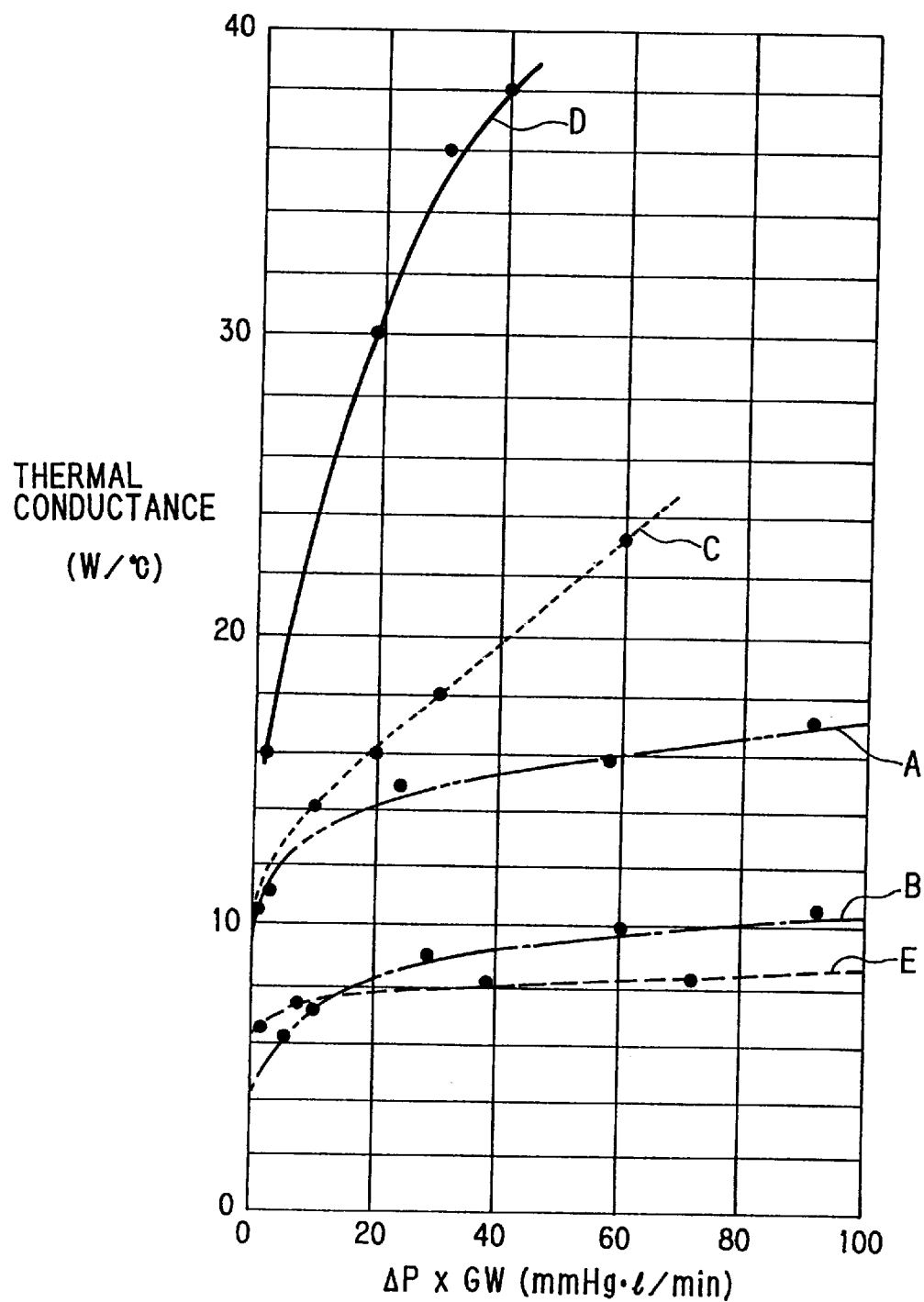
FIG. 21 is a characteristic diagram of thermal conductance of the thermoelectric apparatus according to the respective embodiments of the present invention and a conventional thermoelectric apparatus.
Figure 22:
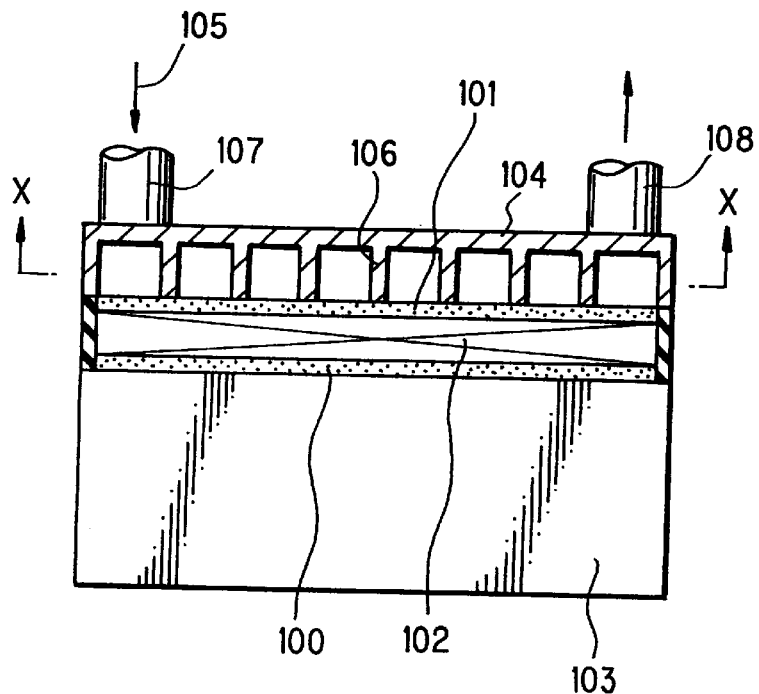
FIG. 22 is a vertical cross-sectional view of the conventional thermoelectric apparatus.

FIG. 21 is the thermal conductance characteristic diagram, in which flow rates (pressure loss ΔP×flow rate $G_w$) of water flowing through a thermoelectric apparatus with electric power supplied in a predetermined quantity to a water feed pump are plotted along the abscissa of the diagram and thermal conductance is plotted along the ordinate. In the diagram, a curve A indicates characteristics of the thermoelectric apparatus according to the present invention shown in FIG. 2, a curve B characteristics of the thermoelectric apparatus according to the present invention shown in FIG. 11, a curve C characteristics of the thermoelectric apparatus according to the present invention shown in FIG. 16, a curve D characteristics of the thermoelectric apparatus according to the present invention shown in FIG. 18, and a curve E characteristics of the conventional thermoelectric apparatus shown in FIG. 22 and FIG. 23.

Figure 23:
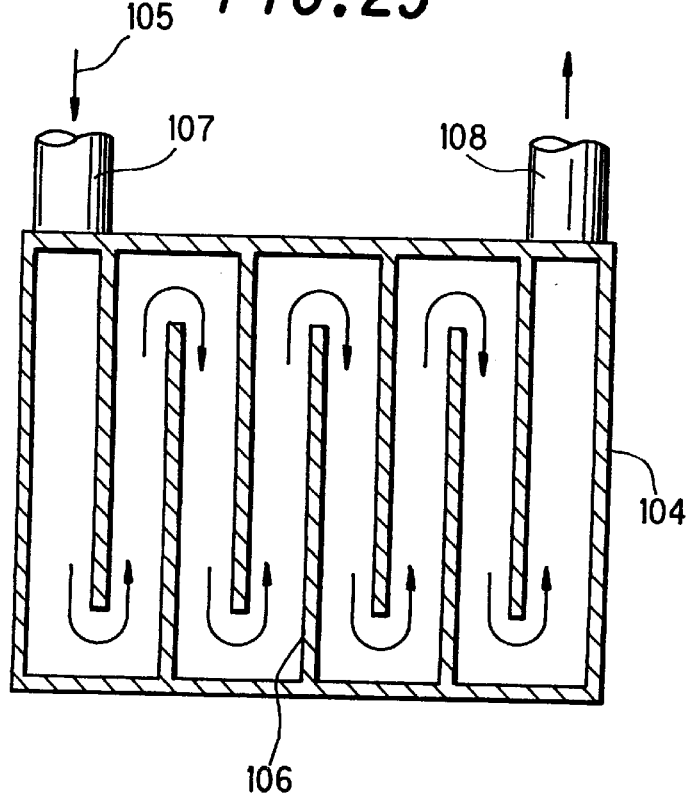
FIG. 23 is a cross-sectional view taken along line X—X of FIG. 22.

As is illustrated in FIG. 23, the flow passage of the water 105 in each conventional thermoelectric apparatus, said flow passage extending from the supply pipe 107 to the drain pipe 108, is narrow, and moreover, is bent plural times into a tortuous form and is long. The water 105 therefore undergoes a substantial pressure loss. Further, the water 105 flows in the state of a substantially laminar flow in parallel with the surface of the heat-dissipating-side insulating substrate 101. The transfer of heat from the heat-dissipating-side insulating substrate 101 to the water 105 is therefore not good, so that the thermal conductance is the smallest as indicated by the curve E.

Compared with the conventional thermoelectric apparatus, the thermoelectric apparatuses according to the respective embodiments of the present invention (curves A–D) are each constructed in such way that the water 21 is supplied to make it strike against the heat transfer surface of the heat-dissipating-side substrate 4 and also that the flow passage of the water 21 is shorter in length than that in the conventional thermoelectric apparatus and the pressure loss is small. The thermoelectric apparatus according to each embodiment of the present invention therefore has high thermal conductance and excellent thermal conductance characteristics.

Capability of Exploitation in Industry

The present invention is to make a liquid heat transfer medium strike against a surface of a substrate as mentioned above. The liquid heat transfer medium is therefore ensured to be brought into contact with the substrate in the state of a turbulent flow, so that an efficient transfer of heat can take place. As a result, the heat exchanging ability of the apparatus as a whole is heightened, thereby permitting excellent performance.

The use of a metal substrate, which has an electrically insulating thin film, as a substrate as described in claim 2 makes it possible to further heighten the heat exchanging ability because the metal substrate has extremely low thermal resistance compared with a substrate such as an alumina substrate.

When, as described in claim 3, a space extending over substantially an entire area of the substrate is formed on a substrate-opposing side of the supply means and the liquid heat transfer medium which has struck against the opposite side of the substrate is allowed to spread within the space, the liquid heat transfer medium is allowed to promptly spread over a wide area in the vicinity of the surface of the substrate. Accordingly, the heat loss is reduced and the heat exchanging ability is heightened.

When, as described in claim 4, the supply means is provided, on a striking path of the heat transfer medium, with a flattened first space, a plurality of spouting holes and a flattened second space extending over substantially an entire area of the substrate so that the first space, the spouting holes and the third space are communicated together from an upstream side toward a downstream side and, further, the liquid heat transfer medium which has flowed in the first space is spouted in a distributed state toward the opposite side of the substrate through the individual spouting holes and the liquid heat transfer medium which has struck against the side of the substrate is allowed to spread within the second space, the distance of the heat transfer medium to the substrate can be shortened and the pressure loss can be reduced, both compared with the corresponding distances and pressure losses in the conventional apparatuses. A still further merit can therefore be brought about in that the heat exchanging ability is heightened further.

The construction of the supply means so that the liquid heat transfer medium strikes against the opposite side of the substrate at substantially a right angle as described in claim 5 makes it possible to perform an efficient transfer of heat by the heat transfer medium.

The provision of the supply means with a number Z' of spouting nozzles which extend close to the side of the substrate, said side being opposite to the semiconductor-layer-supporting side, as described in claim 6 makes it possible to perform a still more efficient transfer of heat by the heat transfer medium.

The formation of concavities and convexities, against which the liquid heat transfer medium strikes, at the opposite side of the substrate, said side being opposite to the semiconductor-layer-supporting side, as described in claims 7 and 8 makes it possible to provide a thermoelectric apparatus which has high thermal conductance and is more excellent in performance as is evident from the results of FIG. 24.

The formation of escape recesses in the vicinity of the spouting nozzles of the distributing member, said spouting nozzles being adapted to spout the liquid heat transfer medium against the substrate, as described in claims 9 and 10 makes it possible to allow the spent heat transfer medium to promptly escape from the surface of the substrate. The transfer of heat is therefore performed efficiently. As a result, the heat exchanging ability of the apparatus as a whole is heightened, thereby permitting excellent performance.

What is claimed is:

1. A thermoelectric apparatus comprising:

a group of thermoelectric elements having N-type semiconductor layers and P-type semiconductor layers, a heat-absorbing-side substrate arranged in contact with a side of said group of thermoelectric elements, a heat-dissipating-side substrate arranged in contact with an opposite side of said group of thermoelectric elements and having a thickness smaller than said heat-absorbing-side substrate, a cover member having a space there inside and provided along a periphery thereof with a peripheral wall, said peripheral wall being closed on an end thereof and being open on an opposite end thereof to define an opening, and a distributing member provided with a number of spouting nozzles;

wherein said opening of said cover member is closed by said heat-dissipating-side substrate, said distributing member is arranged inside said peripheral wall of said cover member, whereby said space of said cover member is divided by said distributing member into a flattened first space and a flattened second space and said first space and said second space are communicated with each other via said spouting nozzles of said distributing member; and a liquid heat transfer medium which has been supplied into said first space is allowed to spread within said first space, is distributed to said individual spouting nozzles and is then spouted toward a surface of said heat-dissipating-side substrate, said surface being on a side opposite to a surface of said heat-dissipating-side substrate where said heat-dissipating-side substrate is maintained in contact with said group of thermoelectric elements, and said liquid heat transfer medium which has struck against said opposite surface is allowed to spread within said second space.

2. A thermoelectric apparatus according to claim 1, wherein said spouting nozzles of said distributing member are formed such that said liquid heat transfer medium strikes against said opposite surface of said heat-dissipating substrate at substantially a right angle.

3. A thermoelectric apparatus according to claim 1, wherein concavities and convexities against which said liquid heat transfer medium strikes are formed on said opposite surface of said heat-dissipating-side substrate.

4. A thermoelectric apparatus according to claim 3, wherein said concavities are formed opposite said spouting nozzles of said distributing member, respectively.

5. A thermoelectric apparatus according to claim 1, wherein escape recesses are arranged in a vicinity of said spouting nozzles of said distributing member such that said liquid heat transfer medium struck against said opposite surface of said heat-dissipating-side substrate is facilitated to flow away from said opposite surface of said heat-dissipating-side substrate.

6. A thermoelectric apparatus according to claim 1, wherein said distributing member is provided with spouting nozzles which extend close to said opposite surface of said heat-dissipating-side substrate.

7. A thermoelectric apparatus according to claim 6, wherein concavities and convexities against which said liquid heat transfer medium strikes are formed on said opposite surface of said heat-dissipating-side substrate.

8. A thermoelectric apparatus according to claim 6, wherein escape recesses are arranged in a vicinity of said spouting nozzles of distributing member such that said liquid heat transfer medium struck against said opposite surface of said heat-dissipating-side substrate is facilitated to flow away from said opposite surface of said heat-dissipating-side substrate.

* * * * *